US005869977A

United States Patent [19]
Kalb, Jr. et al.

[11] Patent Number: 5,869,977
[45] Date of Patent: Feb. 9, 1999

[54] DEFECT INSERTION TESTABILITY MODE FOR IDDQ TESTING METHODS

[75] Inventors: Jeffrey C. Kalb, Jr., Phoenix; Robert W. Daywitt, Tempe, both of Ariz.

[73] Assignee: Intel Corporation, Santa Clara, Calif.

[21] Appl. No.: 719,083

[22] Filed: Sep. 26, 1996

[51] Int. Cl.$^6$ .................................................. G01R 31/26
[52] U.S. Cl. ...................... 324/765; 324/537; 324/158.1
[58] Field of Search .................... 324/765, 537, 324/158.1, 73.1; 327/401; 326/16; 371/21.1, 21.4, 22.6

[56] References Cited

U.S. PATENT DOCUMENTS

| | | | |
|---|---|---|---|
| 5,057,774 | 10/1991 | Verhelst | 324/537 |
| 5,332,973 | 7/1994 | Brown | 324/537 |
| 5,519,333 | 5/1996 | Righter | 324/765 |
| 5,552,744 | 9/1996 | Burlison | 327/401 |
| 5,554,941 | 9/1996 | Kesel | 324/765 |
| 5,670,892 | 9/1997 | Sporck | 324/765 |
| 5,712,857 | 1/1998 | Whitman | 324/765 |

OTHER PUBLICATIONS

David G. Edwards, *Testing For MOS Integrated Circuit Failure Modes*, IEEE, Reprint from Proceedings International Test Conference 1980, pp. 303–312. (no month).

Thomas M. Storey and Wojciech Maly, *CMOS Bridging Fault Detection*, IEEE, Reprint from Proceedings International Test Conference, 1990, pp. 325–334. (no month).

Robert C. Aitken, *A Comparison of Defect Models For Fault Location With IDDQ Measurements*, IEEE, Reprint from Proceedings International Test Conference 1992, pp. 335–344. (no month).

Charles F. Hawkins and Jerry M. Soden, *Electrical Characteristics and Testing Considerations For gate Oxide Shorts In CMOS ICs*, IEEE, Reprint from Proceedings International Test Conference 1995, pp. 313–324. (no month).

*Primary Examiner*—Christine K. Oda
*Attorney, Agent, or Firm*—Blakely, Sokoloff, Taylor & Zafman LLP

[57] ABSTRACT

A Defect Insertion Testability Mode for IDDQ Testing to detect defects in a semiconductor device and for accuracy correction during testing. In one embodiment of the present invention a screen condition and a known defect current are selected for the device under test (DUT). The DUT is screened without a known defect current being inserted and then is screened again with a known defect current inserted. The results of screening the DUT with and without the known defect current are then compared and the screen condition is adjusted based upon this comparison in order to increase the accuracy of the IDDQ test.

19 Claims, 3 Drawing Sheets

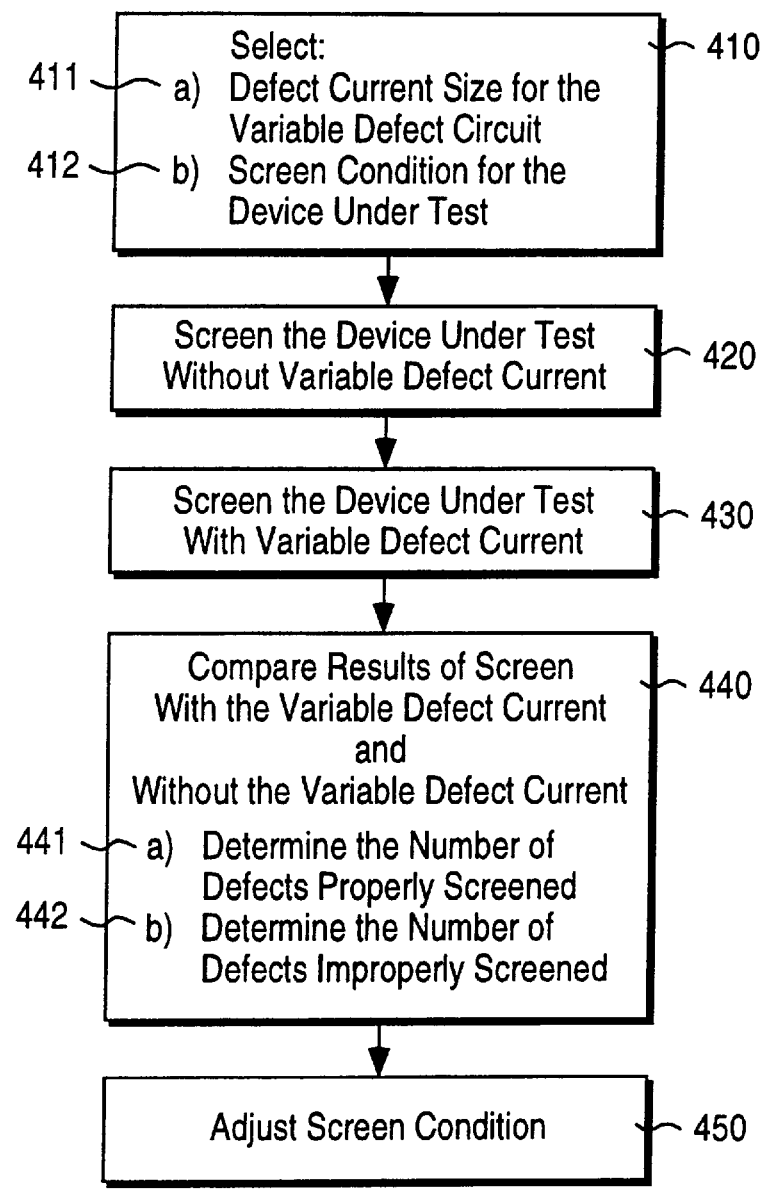

DEFECT INSERTION TESTABILITY MODE FOR IDDQ TESTING METHODS

BACKGROUND OF THE INVENTION

1. Field of the Invention

This invention relates to the field of testing semiconductor devices for defects, and more specifically, to the evaluation of methods for detecting defects in a semiconductor device using IDDQ testing in the presence of high background leakage current.

2. Background Information

In the manufacture of semiconductor devices it is important to have methods for testing a device and determining if it is a good device or if it contains defects before selling such a product to a customer. If the results of the test are within a manufacturer's tolerance levels then the device is presumably a good or non-defective device and may be sold to a customer. If the results are not the same and are not within the manufacturer's tolerance levels then the device is a defective device and cannot be sold to a customer.

One particular method for testing a device for defects is called IDDQ Testing. In a CMOS device when the clock is stopped, the device is said to be in a quiescent state, thus the current in the device is called drain to drain quiescent current (IDDQ). IDDQ derives from quiescent IDD which is the current drawn by the Vdd power supply. The Vdd supply is typically held at a voltage above ground and fixed within narrow bounds. The other supply is typically called Vss and is taken to be ground (i.e. arbitrarily assigned a value of zero electrical potential. In IDDQ testing, a device is tested by measuring the current while the device is in the quiescent state. Since defects often result in significant leakage currents, measuring the quiescent current allows defects such as open and short circuits to be detected. If the IDDQ is above a preset threshold, then the device is termed "defective" and is not sold to the customer.

Prior methods for IDDQ testing require a low background leakage current while in the quiescent state. In such prior methods, the background leakage current is typically required to be less than a few hundred microamps ($\mu$A). As is illustrated in FIG. 1, a statistical sample of devices under test (DUTs) is taken in order to determine a median background leakage current 110. Once a median background leakage current is established then an IDDQ pass/fail limit 120 is set. The pass/fail limit must be set such that it is greater than the median background leakage current but such that it is less than the average current caused by a device defect. Typically in prior methods the pass/fail limit is set at a current much higher than the median, usually from three (3) to six (6) standard deviations greater than the median background leakage current. For example, the pass/fail limit may be in the range of approximately 500 microamps ($\mu$A) to 1.5 milliamps (mA). Any device exhibiting an IDDQ current greater than the pass/fail limit is assumed to be a defective device 130 and is not sold to a customer.

One of the problems with prior art methods for IDDQ testing is that they can only detect defects where the defect causes an IDDQ current larger than the background leakage current. As device dimensions of semiconductor devices become smaller and more dense, the background leakage current increases in relation to the defect currents which must be resolved.

This increase in background leakage current can be traced to several factors. The most prominent of these are the increase in the number of devices on a single substrate and an increase in the subthreshold leakage across a given device as the length of its polysilicon gate decreases. The latter, in turn, can be divided into several components, each of which contributes a share to the total current. For example in submicron CMOS devices, background leakage currents in the range of approximately several tens of milliamps (mA) are likely due to the short channel lengths.

As is illustrated in FIG. 2, a wider distribution in background leakage current makes resolution of the same level of defect current problematic. Since the background leakage is higher, the pass/fail limit 220 must be increased proportionately to avoid the improper rejection of functional devices. Meanwhile, the standard deviation of the background leakage 230 has increased sufficiently to make resolution of smaller defect currents impossible.

Another problem with modes of IDDQ testing is that there is no real way to determine how accurate a method may be at detecting defects. There is also no way to compare one method for IDDQ testing to another since in many of the testing techniques the derived measures which serve as the pass/fail criteria are substantially different from each other. For example, one derived measure may be a unitless ratio of currents, whereas another may be a current itself measured in milliamps. Thus, it is difficult to compare the results of such different techniques without a common standard.

Thus, what is needed is a method for detecting defects in a semiconductor device in the presence of a high background leakage current where the accuracy of the method may be determined and the pass/fail limit optimized. This can save cost and increase quality by increasing the number of defective devices detected and decrease the number of good devices thrown away.

SUMMARY OF THE INVENTION

The present invention describes a method for evaluating IDDQ testing in semiconductor devices and for setting optimal test limits. In one embodiment of the present invention a screen condition and a known defect current are selected for the device under test (DUT). The DUT is first screened without the known defect current and then is screened again with the known defect current. The results of screening the DUT with and without the known defect current are then compared and the screen condition is adjusted based upon this comparison in order to increase the accuracy of the test.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 4 illustrates a flow chart of one embodiment of the present invention.

DETAILED DESCRIPTION

Figure 1:
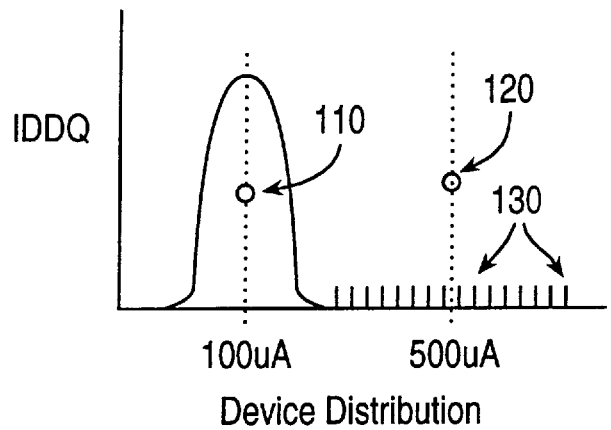
FIG. 1 illustrates a prior technique for detecting defects in a semiconductor device.
Figure 2:
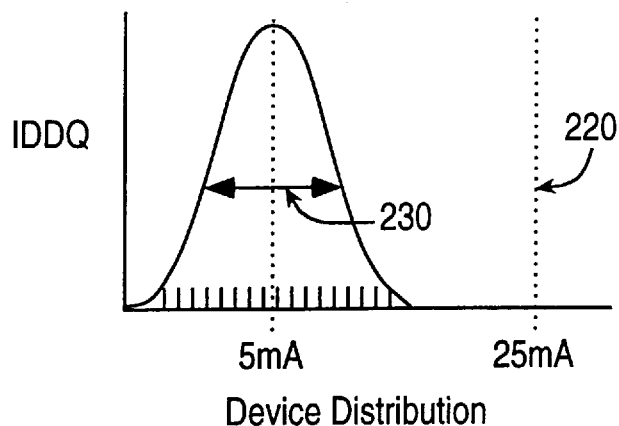
FIG. 2 illustrates the prior technique illustrated in FIG. 1 for detecting defects in submicron devices.

A Defect Insertion Testability Mode for IDDQ Testing Methods is disclosed. In the following description, numerous specific details are set forth such as specific devices, device characteristics, components, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method and apparatus to be used in setting optimum test limits in IDDQ defect screening of semiconductor devices. Additionally, it may be used to evaluate the relative effectiveness of various IDDQ-based screening techniques. This is accomplished by the incorporation of a test mode into the device or tester whereby leakage currents may be enabled and disabled. The ability to detect these leakage currents can then be studied and the most effective screening method and most proper test limit may be selected from among the alternatives. Additionally, the cost effectiveness and suitability of new methods can thereby be gauged and certified.

IDDQ Testing is performed when the clock of a semiconductor device is stopped. When the clock is stopped, the device is said to be in a quiescent state and the current in the device is called IDDQ. It should be noted that IDDQ Testing is typically performed in conjunction with the exercising of the part. These modes of testing are well known in the art. The devices or portions of the devices are exercised until they rest in a particular state to activate any defects that may be present. It should be noted that the following description utilizes the term "screening" to refer to this mode of testing and other types of testing wherein devices are tested in order to determine if a device is a "good" device or a "defective" device.

As described in the background of the invention, one problem with IDDQ testing is that, as semiconductor device dimensions become smaller and their integration more dense, the background leakage current becomes larger, thus making the detection of defects using IDDQ testing more difficult. For example, if the background leakage current becomes too large, and the leakage limit is increased proportionately, then defects with defect currents smaller than standard deviation of the background leakage current may go undetected. In other words, the superposition of a high background leakage makes good devices and bad devices difficult to distinguish. For example, the presence of a defect may add 100 microamps of current while the variability in background leakage current may exceed 1 milliampere. Thus the testing technique must have the ability to resolve the presence of a small defect current "signal" amidst a large background leakage current "noise." As this signal-to-noise ratio decreases, the selection of IDDQ test limits becomes proportionately more critical.

Some of the problems with existing IDDQ test methodologies are linked to the setting or use of pass/fail limits (screen conditions) to determine if a device is "good" or "defective". Prior art methods, such as determining the mean and standard deviation of background current and then setting the pass/fail limit several standard deviations higher than the mean, are not feasible as background leakage currents become larger than the defect currents that are to be detected. Also, there has been no quick and economical way to determine and adjust the accuracy of such prior art testing techniques. Typically one studies actual defects as they exist in actual product. But there are several difficulties with this approach. First, the number of such samples available to the investigator is quite small. Second, it is generally impossible to remove the defect and hence impossible to separate the effect of defect current from background leakage. Finally, one must first determine whether a unit is truly defective before one studies it. This process is very time-consuming.

The need to be able to determine the accuracy with which the pass/fail limit (or screen condition) has been set has become very important. If the screen condition is set too high then bad devices are passed, which are then shipped to customers. If the screen condition is set too low, then good devices are labeled defective, which produces a larger yield loss than is desired. The present invention has the ability to optimize the screen condition for better accuracy and improved results.

The present invention provides a testability mode allowing the insertion of a known defect current into the device under test or into the tester itself in order to determine and adjust the accuracy of the IDDQ technique being used. For example, if a known defect current of approximately 1 mA is inserted during testing, then when the device is screened for defects it would be expected to have an IDDQ current of at least 1 mA. If the known defect current of 1 mA is inserted and passes the screen when it should not have passed (e.g. any defect current of 25 mA or more is deemed by the investigator to be a defective device), then the screen condition may be set too high and might be lowered. If a device fails the screen both with and without the defect current inserted, then the IDDQ limit may be too low and it might be raised. The ability to selectively insert and remove defects from a sample of good devices allows one to characterize accurately the costs due to unnecessary yield loss and that due to undetected defects. A suitable test limit may be chosen to minimize total cost. One embodiment of the present invention uses a variable defect circuit that enables the user to select the size of the known (or variable) defect current.

Figure 3:
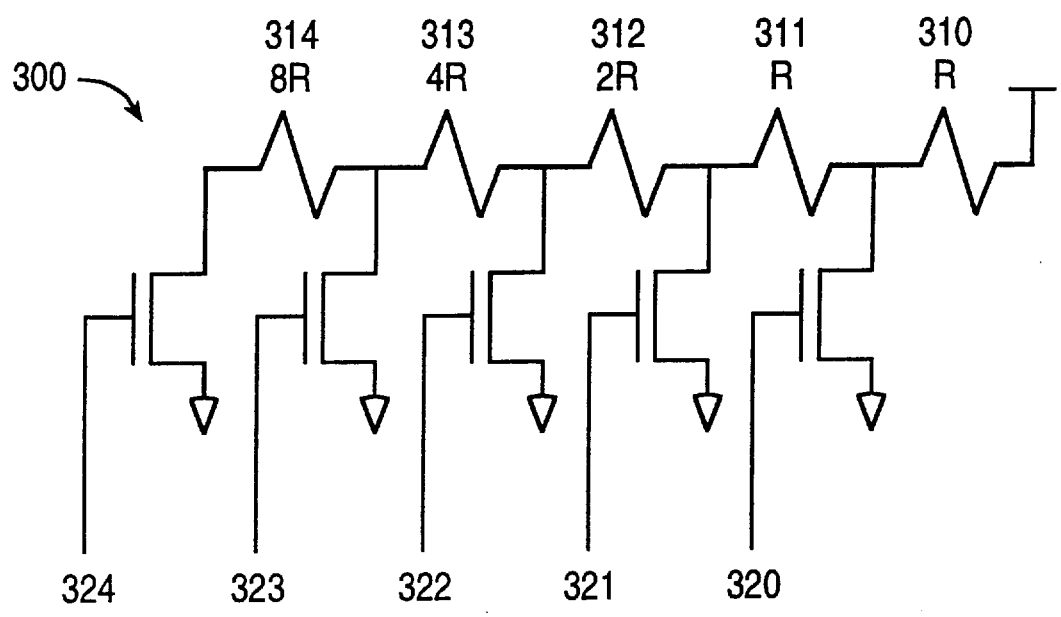
FIG. 3 illustrates a variable defect circuit used in one embodiment of the present invention.

FIG. 3 illustrates a variable defect circuit 300 used in one embodiment of the present invention. In one embodiment, variable defect circuit 300 (circuit 300) is placed directly onto the device under test (i.e. built into the device during manufacture). Circuit 300 is a simple resistive network and would not require any additional or complex processing, thus making circuit 300 relatively easy to build into a device. Additionally, circuit 300 would not require a large amount of space, thus making circuit 300 ideal for use in very dense devices.

The resistive network illustrated in FIG. 3 is made up of resistors (310–314) that have varying resistances and different contact points (320–324). The user (i.e. the person running the test procedure) may select the size of the defect current which he/she desires to simulate during testing by determining the resistance needed to produce such a current and selecting the contact point on circuit 300 which would provide the required resistance. This selection control can be incorporated into the test program. Alternatively, the circuit illustrated in FIG. 3 may be implemented in the test apparatus itself. It should be noted and it will be obvious to one with ordinary skill in the art that circuit 300 is merely illustrative and that many other circuits may be designed and used in a similar fashion.

FIG. 4 illustrates a flow chart of one embodiment of the present invention. At step 410 the user selects the known defect current size to be simulated using the variable defect circuit (substep 411) and the desired screen condition for the device under test (substep 412). Although the user selects the known defect current and the screen condition at step 410, it should be noted and it will be obvious to one with ordinary skill in the art that the user may adjust such criteria at any point in time during testing if the user so desires.

At step 420, the device under test is screened without the variable defect current (i.e. the known defect current is not inserted). In one embodiment of the present invention pattern testing (as was described earlier) is used to place the device under test in a state in which defects are activated, however it will be obvious to one with ordinary skill in the art that other testing techniques for determining if a device is defective may also be used. Screening the devices without the variable defects inserted will indicate whether or not the device under test is passed or failed based upon the screen condition set by the user. The number of failed devices found during step 420 will represent unnecessary yield loss of good devices.

At step 430, the device under test is screened with the variable defect current (i.e. the known defect current is inserted). The same screening technique is used at step 430 as was used during step 420, with the exception of the insertion of the known defect current. The known defect current may be inserted, for example, by enabling the desired portion of circuit 300. Screening the devices with the variable defect current (second screen) will indicate whether or not the device under test is passed or failed based upon the same screen condition used in the first screen and based upon the addition of the known defect current. The number of defective devices found during step 430 will represent the yield loss with the known defect current (second yield loss).

The second yield loss must always be greater than the first yield loss. Additionally, any device that is defective under the first screen must also be defective under the second screen, thereby making the first yield loss a subset of the second yield loss. It should be noted and it will be obvious to one with ordinary skill in the art that a user may wait to compare the results of the first and second screens until several devices have been tested. Screening several devices before comparing the results would allow the user to compare all the results all at once rather than just the results of the first screen and the second screen for each individual device.

When comparing the results of the first screen to the second screen, step 440, the number of defective devices that have properly screened (substep 441) as well as the number of defective devices that have been improperly screened (substep 442) may be determined. It should be noted that there are three types of devices which are likely to result from the comparison of the first screen to the second screen: (1) devices which pass both screens, (2) devices which pass the first screen and fail the second, and (3) devices which fail both screens.

The first type of devices, those which passed both screening tests, indicate that the IDDQ test may be too loose. In this case the screen condition may be set too high, since even when the known defect current is inserted the device still falls below the screen condition and passes as a good device. As stated earlier, generally the size of the known defect current is selected to be what the user would consider to indicate a defective device. Thus, if the devices with the known defect current still pass, then the screen condition should be adjusted and/or the technique being used for IDDQ testing may not be accurate enough for that particular user.

The second type of devices, those which are determined to be good devices in the first screen and defective devices during the second screen, indicate that the IDDQ test is accurate at least to the extent that it successfully screened those devices that have the known defect current inserted.

The third type of devices, those which are determined to be defective devices after going through both screening tests, indicate that the IDDQ test may be too tight. In this case the screen condition may be set too low, since even when the known defect current is not inserted (i.e. is turned off) the IDDQ current still exceeds the screen condition. This may however indicate that there is an actual defect and it is up to the particular user to determine if additional testing is desired or if the number of devices falling into this category are few enough in number that it does not affect the user's desired results.

Using the comparison information, at step 450, the user may then adjust the screen condition, either up or down, in order to improve the accuracy of the particular IDDQ testing technique. If it is found that a large number of good devices exceeded the screen condition and thus were labeled "defective" devices, then the screen condition may be too low and should be adjusted upward. If it is found that a large number of defective devices did not exceed the screen condition and thus were labeled "good" devices, then the screen condition may be too high and should be adjusted downward. Adjusting the screen condition allows the user to improve the accuracy of the testing technique and also allows the user to have more flexibility and control over their yield losses.

It should be noted and it will be obvious to one with ordinary skill in the art, that there are other considerations that a particular user may find to be important and that may dictate how the user interprets the results of the comparison at step 440. For example, one user may desire to err on the side of throwing away more good devices rather than have defective devices reach the customer, and thus would use the comparison information to tailor his IDDQ testing accordingly. Another user on the other hand, may find that very few devices are actually defective and therefore find it more beneficial to err on the side of letting more potentially defective devices reach the customer than get thrown away.

It should also be noted that the present invention may be used to determine which type (or technique) of IDDQ testing best fits a user's needs. In other words, by using the present invention in conjunction with several different IDDQ testing techniques and then comparing the results from each of the IDDQ testing techniques, a user may determine which particular IDDQ testing technique(s) is the most accurate, economical, and suited to fit their requirements.

Additionally, it should be noted and it will be obvious to one with ordinary skill in the art that the order in which the steps of the present invention are performed may be altered while still achieving the desired results.

Thus, a Defect Insertion Testability Mode for IDDQ Testing Methods has been described. Although specific embodiments, including specific devices, parameters, methods, and components have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for evaluating IDDQ testing comprising:
    selecting a screen condition for a device under test;
    screening said device under test without enabling a known defect current;
    screening said device under test with said known defect current enabled;
    comparing the results of said step of screening said device under test with said known defect current with the results of said step of screening said device under test without said known defect current; and adjusting said screen condition.

2. The method as described in claim 1 wherein said known defect current is provided by a defect circuit that is built into said device under test.

3. The method as described in claim 2 wherein said known defect circuit is a variable defect circuit and said known defect current is chosen such that said known defect current is greater than said background leakage current.

4. The method as described in claim 2 wherein said known defect current is provided by a defect circuit that is built into a tester apparatus.

5. The method as described in claim 4 wherein said known defect circuit is a variable defect circuit and said known defect current is chosen such that said known defect current is greater than said background leakage current.

6. The method as described in claim 1 wherein said step of comparing the results of said screening steps comprises:

determining the number of defects properly screened and the number of defects improperly screened in said step of screening said device under test with said known defect current; and determining the number of good devices that exceeded said screen condition.

7. The method as described in claim 1 wherein said screen condition is adjusted in order to increase the accuracy with which defective devices are detected.

8. A method for evaluating IDDQ testing comprising:

selecting a defect current size for a variable defect circuit;

selecting a screen condition for a device under test;

screening said device under test without enabling said variable defect current;

screening said device under test with said variable defect current enabled;

comparing the results of said step of screening said device under test with said variable defect current with the results of said step of screening said device under test without said variable defect current; and adjusting said screen condition.

9. The method as described in claim 8 wherein said variable defect circuit is built into said device under test.

10. The method as described in claim 8 wherein said defect current size is chosen such that said defect current is greater than said background leakage current.

11. The method as described in claim 8 wherein said known defect current is provided by a defect circuit that is built into a tester apparatus.

12. The method as described in claim 8 wherein said step of comparing the results of said screening steps comprises:

determining the number of defects properly screened and the number of defects improperly screened in said step of screening said device under test with said variable defect current; and determining the number of good devices that exceeded said screen condition.

13. The method as described in claim 8 wherein said screen condition is adjusted in order to increase the accuracy with which defective devices are detected.

14. A method for determining the accuracy of an IDDQ testing process performed on devices with high background leakage current comprising:

selecting a defect current size for a variable defect circuit;

selecting a screen condition for said device under test;

screening said device under test without enabling said variable defect current;

screening said device under test with said variable defect current enabled;

comparing the results of said step of screening said device under test with said variable defect current with the results of said step of screening said device under test without said variable defect current in order to determine the accuracy of said selected screen condition; and adjusting said screen condition.

15. The method as described in claim 14 wherein said variable defect circuit is built into said device under test.

16. The method as described in claim 14 wherein said defect current size is chosen such that said defect current is greater than said background leakage current.

17. The method as described in claim 14 wherein said known defect current is provided by a defect circuit that is built into a tester apparatus.

18. The method as described in claim 14 wherein said step of comparing the results of said screening steps comprises:

determining the number of defects properly screened and the number of defects improperly screened in said step of screening said device under test with said variable defect current; and determining the number of good devices that exceeded said screen condition.

19. The method as described in claim 14 wherein said screen condition is adjusted in order to increase the accuracy with which defective devices are detected.

* * * * *